(12) United States Patent
Pei (10) Patent No.: US 11,264,334 B2
(45) Date of Patent: Mar. 1, 2022

(54) PACKAGE DEVICE AND METHOD OF MANUFACTURING THE SAME

(71) Applicant: NANYA TECHNOLOGY CORPORATION, New Taipei (TW)

(72) Inventor: Han-Ning Pei, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/360,662

(22) Filed: Mar. 21, 2019

(65) Prior Publication Data
US 2020/0211978 A1   Jul. 2, 2020

Related U.S. Application Data

(60) Provisional application No. 62/785,412, filed on Dec. 27, 2018.

(51) Int. Cl.
| | |
|---|---|
| *H01L 23/552* | (2006.01) |
| *H01L 23/498* | (2006.01) |
| *H01L 23/29* | (2006.01) |
| *H01L 23/31* | (2006.01) |
| *H01L 21/56* | (2006.01) |

(52) U.S. Cl.
CPC .......... *H01L 23/552* (2013.01); *H01L 21/565* (2013.01); *H01L 23/295* (2013.01); *H01L 23/3128* (2013.01); *H01L 23/3135* (2013.01); *H01L 23/49816* (2013.01); *H01L 23/49827* (2013.01)

(58) Field of Classification Search
CPC ..... H01L 23/29; H01L 23/293; H01L 23/295; H01L 23/296; H01L 23/3128; H01L 23/3135; H01L 23/552
See application file for complete search history.

(56) References Cited

U.S. PATENT DOCUMENTS

| | | |
|---|---|---|
| 5,436,203 A | 7/1995 | Lin |
| 6,472,598 B1 | 10/2002 | Glenn |
| 6,962,829 B2 | 11/2005 | Glenn et al. |

(Continued)

FOREIGN PATENT DOCUMENTS

| | | |
|---|---|---|
| CN | 1768112 B | 7/2010 |
| CN | 102280390 A | 12/2011 |

(Continued)

OTHER PUBLICATIONS

Filler (materials), <https://en.wikipedia.org/wiki/Filler_(materials)> (Year: 2020).*

*Primary Examiner* — Robert G Bachner
*Assistant Examiner* — Molly K Reida
(74) *Attorney, Agent, or Firm* — Muncy, Geissler, Olds & Lowe, P.C.

(57) ABSTRACT

The present disclosure provides a package device and a method of manufacturing the same. The package device includes a supporting member, a main component, a sealant, and a conductive encapsulant. The supporting member includes a plurality of grounding contacts. The main component is mounted on the supporting member. The sealant covers the main component. The conductive encapsulant encases the sealant and the grounding contacts exposed through the sealant for EMI shielding.

9 Claims, 12 Drawing Sheets

(56) References Cited

U.S. PATENT DOCUMENTS

| | | | | |
|---|---|---|---|---|
| 8,012,799 | B1* | 9/2011 | Ibrahim | H01L 23/4334 |
| | | | | 438/107 |
| 8,710,635 | B2 | 4/2014 | Pagaila et al. | |
| 2002/0160624 | A1* | 10/2002 | Yamakawa | H01L 21/3122 |
| | | | | 438/780 |
| 2002/0167898 | A1* | 11/2002 | Thang | H04L 45/02 |
| | | | | 370/216 |
| 2002/0168798 | A1* | 11/2002 | Glenn | H01L 23/552 |
| | | | | 438/113 |
| 2003/0002271 | A1* | 1/2003 | Nurminen | H01L 23/3128 |
| | | | | 361/818 |
| 2004/0159927 | A1* | 8/2004 | Loo | B81C 1/00269 |
| | | | | 257/678 |
| 2017/0358540 | A1* | 12/2017 | Min | H01L 23/295 |
| 2019/0295944 | A1* | 9/2019 | Kwon | H01L 24/32 |

FOREIGN PATENT DOCUMENTS

| | | |
|---|---|---|
| CN | 107507823 A | 12/2017 |
| JP | 2014-207489 | 10/2014 |
| JP | 2014207489 A | 10/2014 |
| TW | 200408019 | 5/2004 |
| TW | 200408019 A | 5/2004 |
| TW | I584501 B | 5/2017 |
| TW | I-584501 B | 5/2017 |

\* cited by examiner

PACKAGE DEVICE AND METHOD OF MANUFACTURING THE SAME

PRIORITY CLAIM AND CROSS-REFERENCE

This application claims the priority benefit of U.S. provisional application Ser. No. 62/785,412, filed on Dec. 27, 2018. The entirety of the above-mentioned patent application is hereby incorporated by reference herein and made a part of this specification.

TECHNICAL FIELD

The present disclosure relates to a package device and a method of manufacturing the same, and more particularly, to a package device with EMI shielding and a method of manufacturing the same.

DISCUSSION OF THE BACKGROUND

Semiconductor devices have become progressively more complex, driven by the demand for enhanced processing speeds and smaller sizes. While the benefits of enhanced processing speeds and smaller sizes are clear, these characteristics of semiconductor devices can also create problems. In particular, higher clock speeds involve more frequent transitions between signal levels, which, in turn, lead to higher levels of electromagnetic radiation at higher frequencies or shorter wavelengths. Electromagnetic radiation is emitted from a source semiconductor device, and can propagate onto neighboring semiconductor devices. If the level of electromagnetic radiation onto a neighboring semiconductor device is sufficiently high, such radiation can adversely affect the operation of that semiconductor device. This phenomenon is sometimes referred to as electromagnetic interference (EMI). Smaller sizes of semiconductor devices can exacerbate EMI by enabling a greater density of the semiconductor devices within an electronic system, and, thus, a higher level of undesired electromagnetic radiation at a neighboring semiconductor device.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a package device. The package device includes a supporting member, a main component, a sealant and a conductive encapsulant. The supporting member includes a plurality of grounding contacts. The main component is mounted on the supporting member and is electrically connected to the supporting member. The sealant covers the main component. The conductive encapsulant encases the sealant and the grounding contacts exposed through the sealant.

In some embodiments, the supporting member includes a substrate, a plurality of grounding vias and a plurality of solder bumps; the grounding contacts are disposed on a front surface of the substrate and a back surface opposite to the front surface; the grounding vias penetrate through the substrate and electrically connect the grounding contacts on the front surface to the grounding contacts on the back surface; and the solder bumps are attached to the grounding contacts on the back surface.

In some embodiments, the package device further includes at least one wire bonded from the main component to a plurality of circuit patterns on the supporting member, wherein the circuit patterns are placed on the front surface and the back surface, and the circuit patterns on the front surface are electrically connected to the circuit patterns on the back surface using a plurality of through vias extending through the front surface and the back surface.

In some embodiments, an electrical pathway for grounding undesired electromagnetic radiation is introduced into the solder bumps, the grounding contacts, the grounding vias, and the conductive encapsulant when a grounding voltage is applied to the solder bumps.

In some embodiments, the conductive encapsulant has a lateral surface coplanar with a sidewall of the substrate.

In some embodiments, the conductive encapsulant includes a resin binder and a plurality of conductive particles distributed in the resin binder.

In some embodiments, the resin binder has a melting point less than a melting point of the sealant.

In some embodiments, the package device further includes a plurality of toner particles distributed in the sealant.

In some embodiments, the conductive encapsulant has a substantially flat upper surface.

Another aspect of the present disclosure provides a method of manufacturing a package device. The method includes steps of providing a main device, wherein the main device comprises a supporting member and a main component disposed on the supporting member and electrically connected to the supporting member, wherein the supporting member comprises a plurality of grounding contacts encircling the main component; performing a molding process to form a sealant to cover the main component; and performing an encapsulation process to form a conductive encapsulant to encase the sealant and the grounding contacts.

In some embodiments, the method further includes a step of mounting a plurality of solder bumps onto the grounding contacts on a back surface of a substrate of the supporting member, wherein the grounding contacts are disposed on back surface and a front surface opposite to the a back surface, and wherein the supporting member further includes a plurality of grounding vias penetrating through the substrate and electrically connecting the grounding contacts on the front surface to the grounding contacts on the back surface.

In some embodiments, the encapsulation process includes steps of placing the main component, covered with the sealant, into a first molding cavity; placing the conductive encapsulant in a second molding cavity; applying a pressure to force the sealant to come into contact with the conductive encapsulant; and curing the conductive encapsulant.

In some embodiments, the method further includes a step of melting the conductive encapsulant before the applying of the pressure.

In some embodiments, the method further includes a step of distributing a plurality of conductive particles in a resin binder to form the conductive encapsulant.

In some embodiments, the method further includes a step of depositing an adhesive between the main component and the supporting member to secure the main component to the supporting member.

In some embodiments, the method further includes a step of applying a plurality of toner particles within the sealant.

With the above-mentioned configurations of the package device, the conductive encapsulant, which covers the main component, contains conductive particles, thereby creating an electrical pathway for grounding undesired electromagnetic radiation when the grounding voltage is applied to the encapsulant, such that an EMI shielding functionality is provided.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
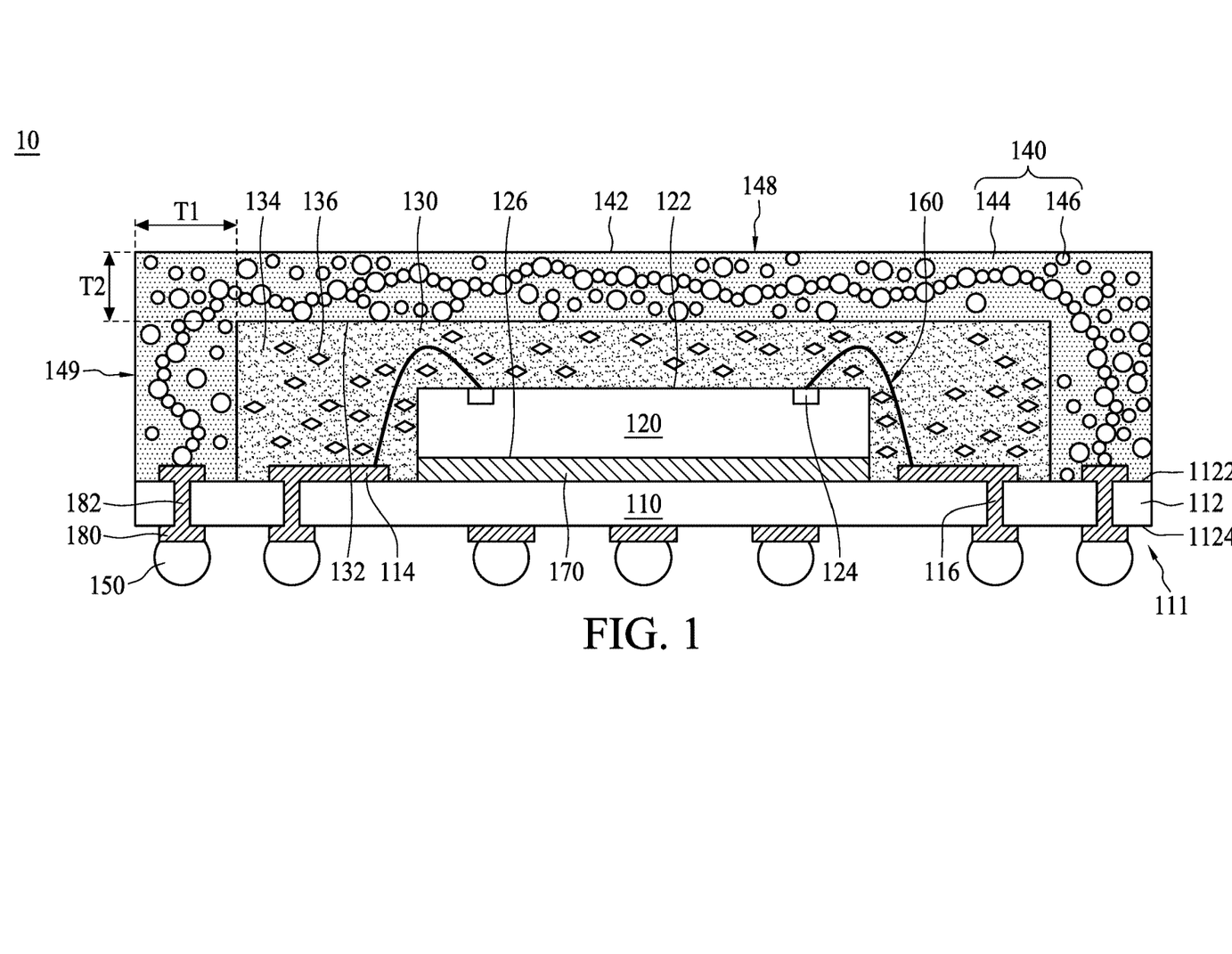
FIG. 1 is a cross-sectional view of a package device in accordance with some embodiments of the present disclosure.

FIG. 1 is a cross-sectional view of a package device 10 in accordance with some embodiments of the present disclosure. Referring to FIG. 1, in some embodiments, the package device 10 includes a supporting member 110, a main component 120 disposed on the supporting member 110, a sealant 130 covering the main component 120, and a conductive encapsulant 140 encasing the sealant 130.

In some embodiments, the supporting member 110 includes a substrate 112 having a front surface 1122, a back surface 1124 opposite to the front surface 1122, a plurality of circuit patterns 114 disposed on the front surface 1122 and the back surface 1124 respectively, and a plurality of through vias 116 penetrating the substrate 112 and electrically connected to the circuit patterns 114. In some embodiments, the substrate 112 may be made of dielectric material, for example, BT resin or FR4 epoxy/glass. In some embodiments, the circuit patterns 114 may be gold-plated conductors, copper-plated conductors, or aluminum-plated conductors. In some embodiments, the through vias 116 may be copper conductors. In some embodiments, the supporting member 110 may be a printed circuit board (PCB). In some embodiments, the supporting member 110 may be a rigid PCB or a flexible PCB. In some embodiments, the supporting member 110 may be a single-layered PCB. In some embodiments, the supporting member 110 may be a multi-layered PCB that includes routing (not shown) within the substrate 112 and is electrically connected to the circuit patterns 114 and/or the through vias 116.

In some embodiments, the package device 10 may further include a plurality of solder bumps 150 attached to the circuit patterns 114 placed on the back surface 1124. In some embodiments, the solder bumps 150 serve as input/output (I/O) connections to electrically connect the main component 120 to an external printed circuit board (not shown).

In some embodiments, the main component 120 is mounted on the front surface 1122. In some embodiments, the main component 120 includes a functional surface 122 facing away from the supporting member 110 and one or more bonding pads 124 placed on the functional surface 122. In some embodiments, the bonding pads 124 may be aluminum bonding pads. In some embodiments, the main component 120 is electrically connected to the supporting member 110 by wire bonding technique; that is, the bonding pads 124 are electrically connected to the circuit patterns 114 through one or more wires 160. In the other words, the wires 160 extend from the bonding pad 124 on the main component 120 to the circuit patterns 114 on the front surface 1122.

In some embodiments, an adhesive 170, for example epoxy, may be applied to couple a lower surface 126 opposite to the functional surface 122 to the front surface 1122 of the substrate 112, so that the adhesion between the main component 120 and the supporting member 110 can be increased, for greater reliability.

In some embodiments, the sealant 130 completely covers the main component 120 and the wires 160 for mechanical and environmental protection. In some embodiments, a periphery 111 of the supporting member 110 is exposed through the sealant 130. In some embodiments, the sealant 130 may have a flat top surface 132. In some embodiments, the sealant 130 may include epoxy-based resin, polyimide-based resin, polyester-based resin or polyacrylate-based polymer resin.

In some embodiments, the sealant 130 may be transparent or opaque. While the sealant 130 is opaque, black color is preferred. The black color radiates the most heat and is most effective for dissipating heat from the main component 120 to the wires 160 and the circuit patterns 114. In some embodiments, the black color may be formed by the addition of toner particles 134. In some embodiments, the toner particles 134, including, for example carbon, may additionally be applied within the sealant 130 to readily transfer heat generated from the main component 120 to the supporting member 110, and the thermal dissipating property of the package device 10 is thus improved. By placing the toner particles 134 in the sealant 130, the curing time of the sealant 130 can be reduced. In some embodiments, the sealant 130 may contain a filler material 136 for reinforcing a mechanical characteristic. In detail, the filler material 136 functions to prevent the mechanical characteristics of the sealant 130 from deteriorating when bonding the main component 120. In some embodiments, the filler material 136 may include silicon oxide, silicon dioxide, titanium dioxide or aluminum oxide.

In some embodiments, the conductive encapsulant 140 completely encases the sealant 130 and the periphery 111 of the supporting member 110. In some embodiments, the conductive encapsulant 140 may have a flat upper surface 142. In some embodiments, the conductive encapsulant 140 includes a resin binder 144 and a plurality of conductive particles 146, for example, aluminum, copper, gold, zinc or silver, distributed in the resin binder 144. In some embodiments, the conductive encapsulant 140 contains the conductive particles 146 at a designated concentration, which allows for an electrical connection. In some embodiments, the conductive encapsulant 140 may be a compression molding encapsulant or a transfer molding encapsulant. In some embodiments, the conductive encapsulant 140 has a top wall 148 connected to the upper surface 142 and a peripheral wall 149 extending from the top wall 148, wherein the peripheral wall 149 has a thickness T1 greater than a thickness T2 of the top wall 149.

In some embodiments, the package device 10 may further include a plurality of grounding contacts 180 placed on the front surface 1122 and the back surface 1124 on the periphery 111 of the supporting member 110, and a plurality of grounding vias 182 penetrating the supporting member 110 and electrically connected to the grounding contacts 180. In some embodiments, the conductive encapsulant 140 encases the grounding contacts 180 on the front surface 1122. In some embodiments, an electrical pathway for grounding undesired electromagnetic radiation is introduced into the solder bumps 150 connected to the grounding contacts 180, the grounding vias 182, and the conductive encapsulant 140 when the solder bumps 180 are electrically connected to a grounding voltage. In some embodiments, grounding of electromagnetic radiation incident upon the conductive encapsulant 140 can occur through an electrical pathway including the grounding contacts 180, the grounding vias 182 and the solder bumps 150 connected to the grounding contacts 180. In some embodiments, the package device 10 may be a fine-pitch ball grid array (FBGA) package device.

Figure 2:
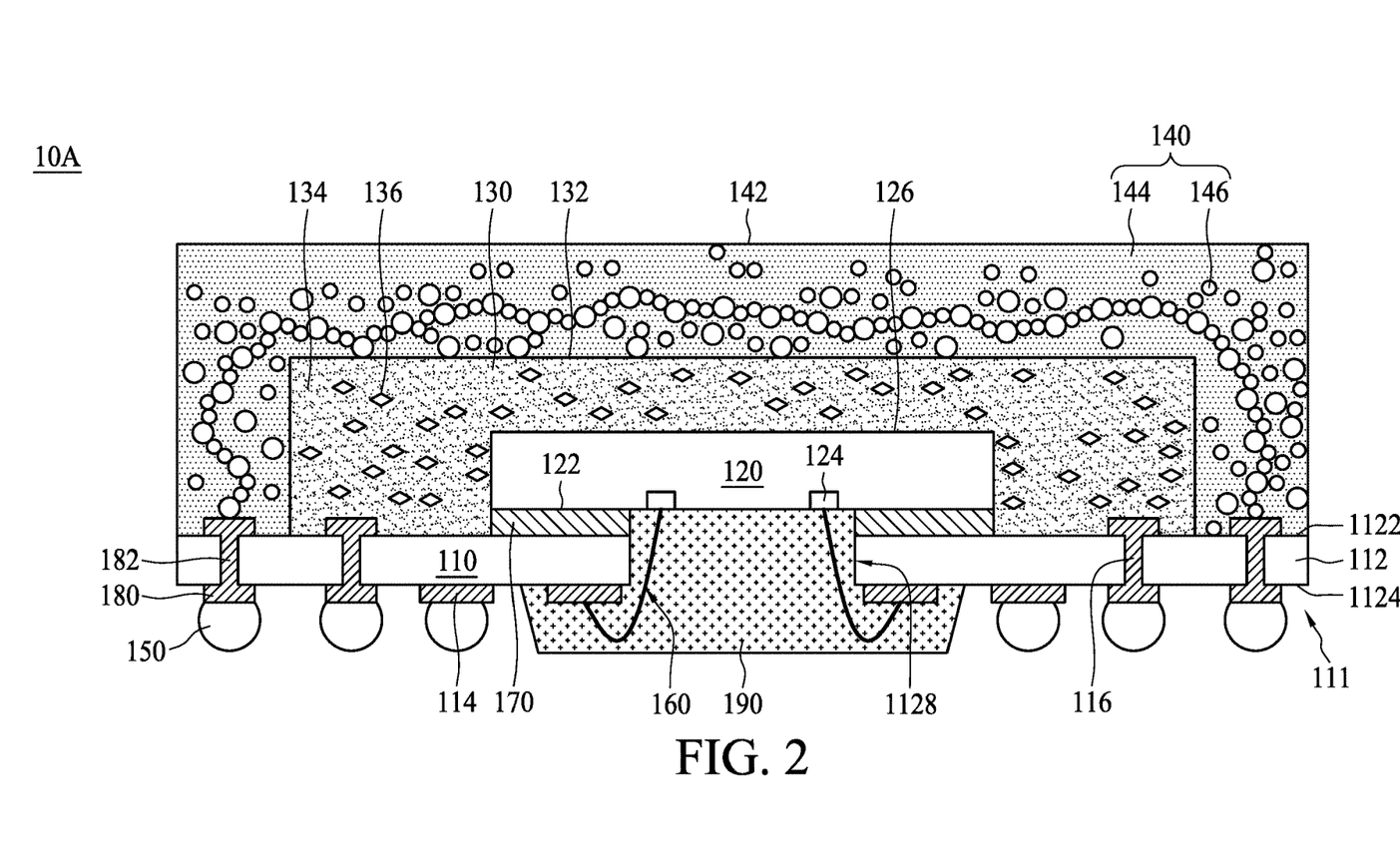
FIG. 2 is a cross-sectional view of a package device in accordance with some embodiments of the present disclosure.
Figure 3:
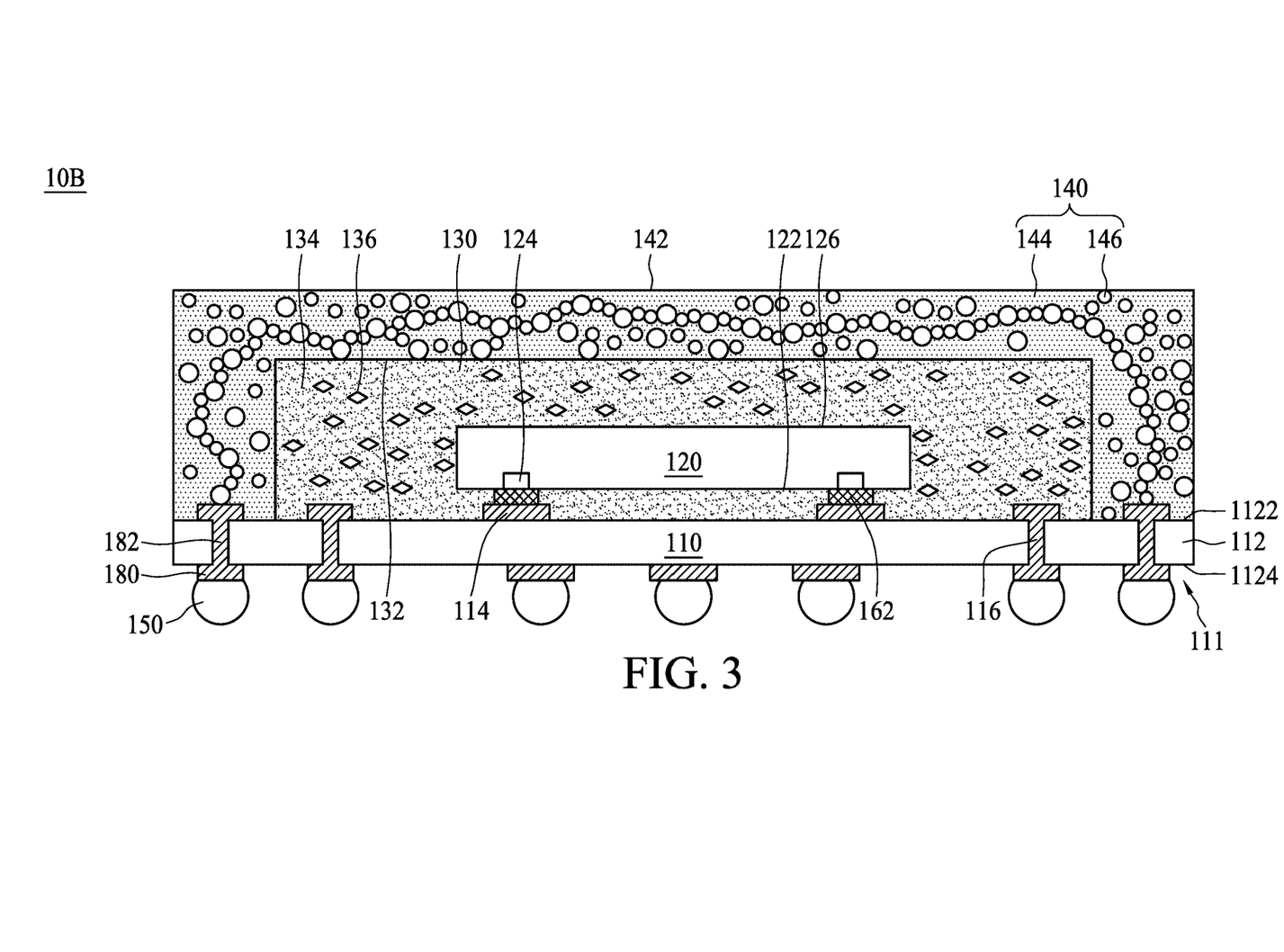
FIG. 3 is a cross-sectional view of a package device in accordance with some embodiments of the present disclosure.

Some of the embodiments of the package devices 10A, 10B are depicted in FIGS. 2 and 3 for illustration. It should be noted that the package devices 10A, 10B shown in FIGS. 2 and 3 contain many features that are same as or similar to features of the package device 10 disclosed with respect to FIG. 1. For purpose of clarity and simplicity, details of same or similar features may be omitted, and the same or similar reference numbers denote the same or like components. The main difference between the package devices 10A, 10B, shown in FIGS. 2 and 3 and the package device 10 shown in FIG. 1 are described as follows.

Referring to FIG. 2, the package device 10A is a window ball grid array (WBGA) package device. In some embodiments, the substrate 112 of the package device 10A includes an opening 112S extending through the front surface 1122 and the back surface 1124. In some embodiments, the opening 112S is formed substantially in the center of the substrate 112. In some embodiments, the functional surface 122 is mounted in a face-down manner to allow the functional surface 122 to be disposed on the front surface 1122 and over one end of the opening 112S, such that bonding pads 124 of the main component 120 can be exposed via the opening 112S and electrically connected to the corresponding circuit patterns 114 on the back surface 1124 by the wires 160 going through the opening 112S. In some embodiments, the package device 10A further includes an under-filler 190 formed on the back surface 1124 of the supporting member 110 and filled into the opening 112S to encase the wires 160. In some embodiments, the under-filler 190 may be transparent or opaque. In some embodiments, the under-filler 190 and the sealant 130 may have the same material. In some embodiments, toner particles may additionally be applied within the under-filler 190, so that heat generated from the main component 120 can be readily transferred to the supporting member 110, and the thermal dissipating property of the package device 10A can be improved. In some embodiments, the conductive encapsulant 140 is a substantially conformal encapsulant.

Referring to FIG. 3, the package device 10B is a flip-chip scale package device. In some embodiments, the functional surface 122 of the main component 120 faces the substrate 112, and the bonding pads 124 of the main component 120 are electrically connected to the circuit s patterns 114 placed on the front surface 1122 by way of electrical interfaces 162 including a solderable alloy, such as a tin-silver-copper (SnAgCu) alloy, a tin-lead (SnPb) alloy, or a tin-antimony (SnSb) alloy. The electrical interfaces 162 preferably have a melting point higher than the melting point of the solder bumps 150 to at least substantially prevent reflow of the electrical interfaces 162 when the solder bumps 150 are subjected to a reflow process.

Figure 4:
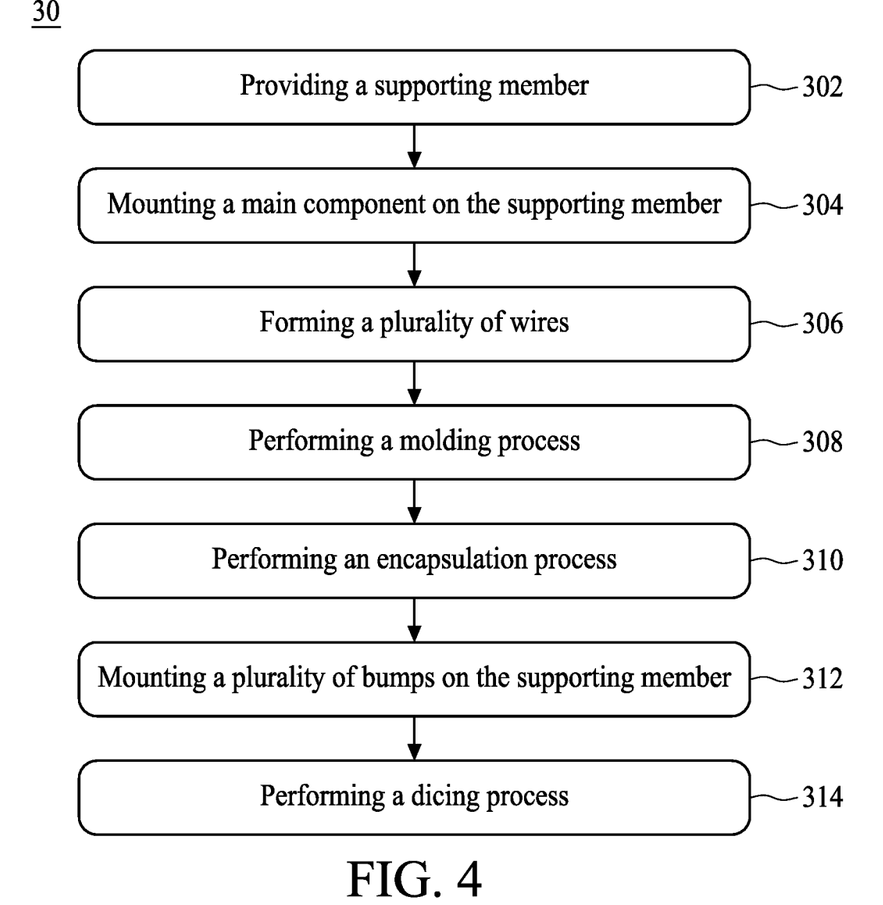
FIG. 4 is a flow diagram illustrating a method of manufacturing a package device in accordance with some embodiments of the present disclosure.

FIG. 4 is a flow diagram illustrating a method 30 of manufacturing a package device 10 in accordance with some embodiments of the present disclosure. FIGS. 5 to 11 are schematic diagrams illustrating various fabrication stages constructed according to the method 30 for manufacturing the package device 10 in accordance with some embodiments of the present disclosure. The stages shown in FIGS. 5 to 11 are also illustrated schematically in the flow diagram in FIG. 4. In the subsequent discussion, the fabrication stages shown in FIGS. 5 to 11 are discussed in reference to the process steps shown in FIG. 4. It should be noted that the method 30 is discussed in connection with the packaging of a single main component 120. However, the methodology applies equally to the packaging of multiple individual main components 120 that can perform various functions.

Figure 5:
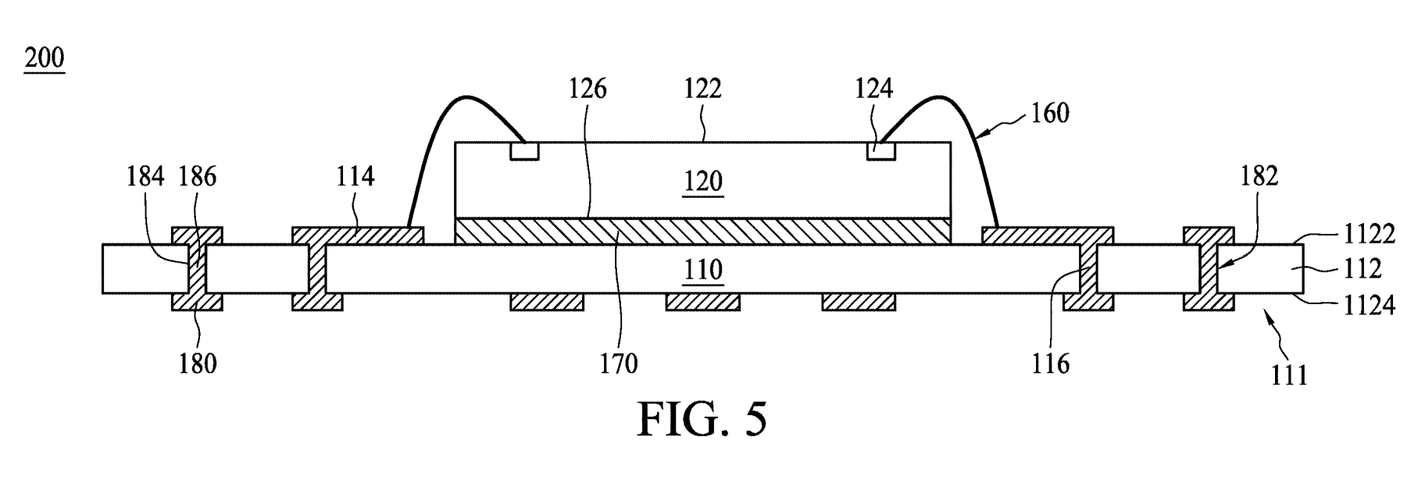
FIGS. 5, 6A, 6B, and 7 through 11 illustrate cross-sectional views of intermediate stages in the formation of a package device in accordance with some embodiments of the present disclosure.

Referring to FIG. 5, in some embodiments, a supporting member 110 is provided according to a step 302 in FIG. 4. In some embodiments, the supporting member 110 includes a substrate 112 having an approximately planar front surface 1122 and an approximately planar back surface 1124 opposite to the front surface 1122. In some embodiments, a plurality of circuit patterns 114 and a plurality of grounding contacts 180 are placed on the front surface 1122 and the back surface 1124, respectively, wherein the grounding contacts 180 are disposed at a periphery 111 of the supporting member 110. In some embodiments, a plurality of through vias 116 penetrate through the substrate 112 and are electrically connected to the circuit patterns 114, and a plurality of grounding vias 182 penetrate through the substrate 112 and are electrically connected to the grounding contacts 180. In some embodiments, the through vias 116 and the grounding vias 182 are formed by steps of performing a drilling step to form a plurality of through holes 184 extending through the front surface 1122 and the back surface 1124, and performing a plating step to form conductors 186 in the through holes 184.

Next, a main component 120 is mounted on the supporting member 110 according to a step 304 in FIG. 4. In some embodiments, the main component 120 has a lower surface 126 facing the front surface 1122 of the supporting member 110. In some embodiments, the main component 120 may be a memory die, a logic die, or an application-specific integrated circuit (ASIC) die. In some embodiments, the main component 120 may be attached to the front surface 1122 using, for example, an adhesive 170 disposed on the lower surface 126. In some embodiments, the adhesive 170 may be a die attach film (DAF) or any suitable adhesive, such as glue or epoxy.

Next, one or more wires 160 are formed to allow electrical connection of the main component 120 to the supporting member 110 according to a step 306 in FIG. 3. Accordingly, a main device 200 is formed. In some embodiments, the main component 120 has a functional surface 122 opposite to the lower surface 126 and one or more bonding pads 124 disposed on the functional surface 122; one end of each of the wires 160 is connected to one of the bonding pads 124, and the other end of each of the wires 160 is connected to one of the circuit patterns 116 on the front surface 1122. In some embodiments, the wires 160 may be gold, copper, aluminum, or the like.

Figure 6A:
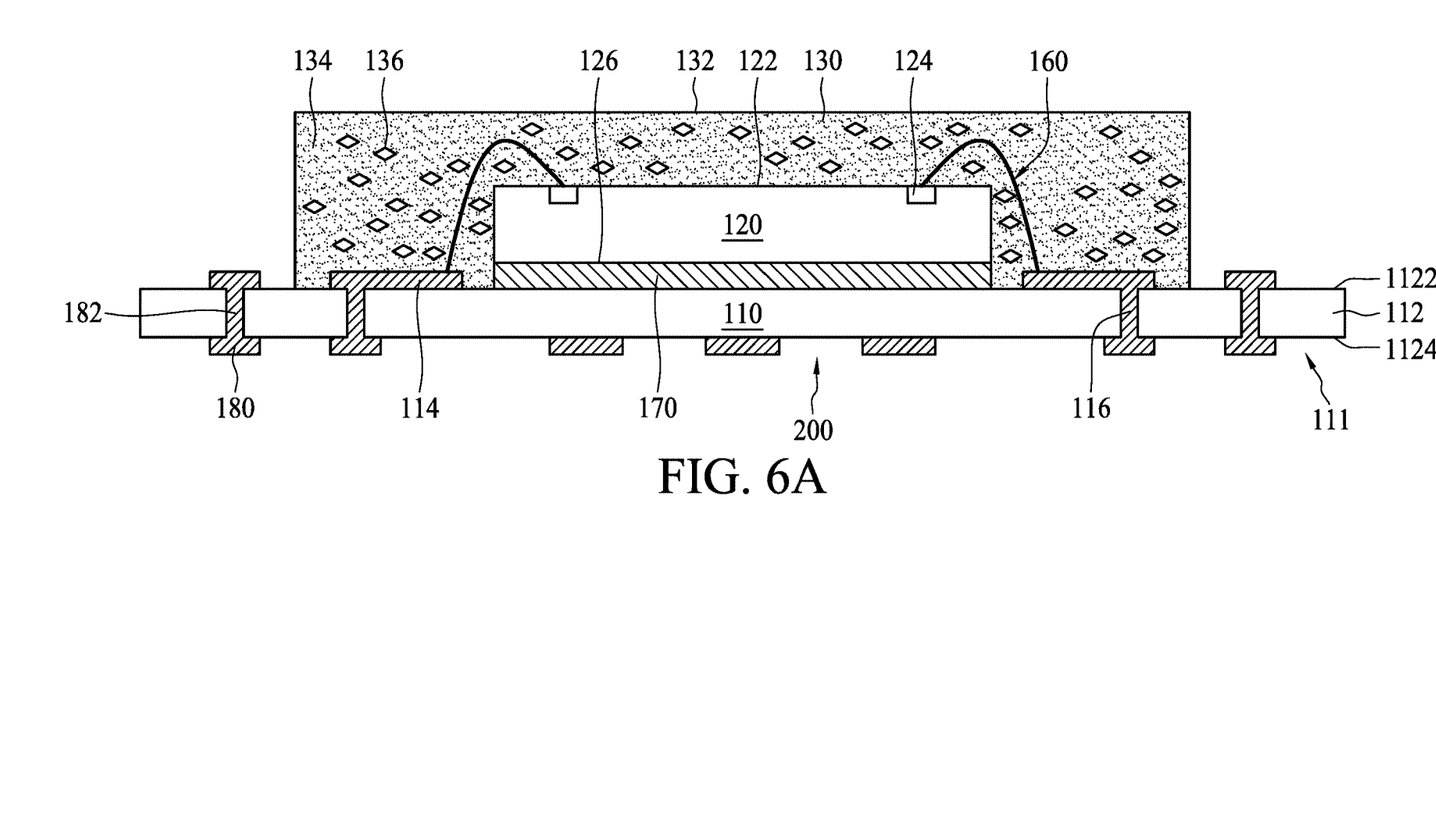
Figure 6B:
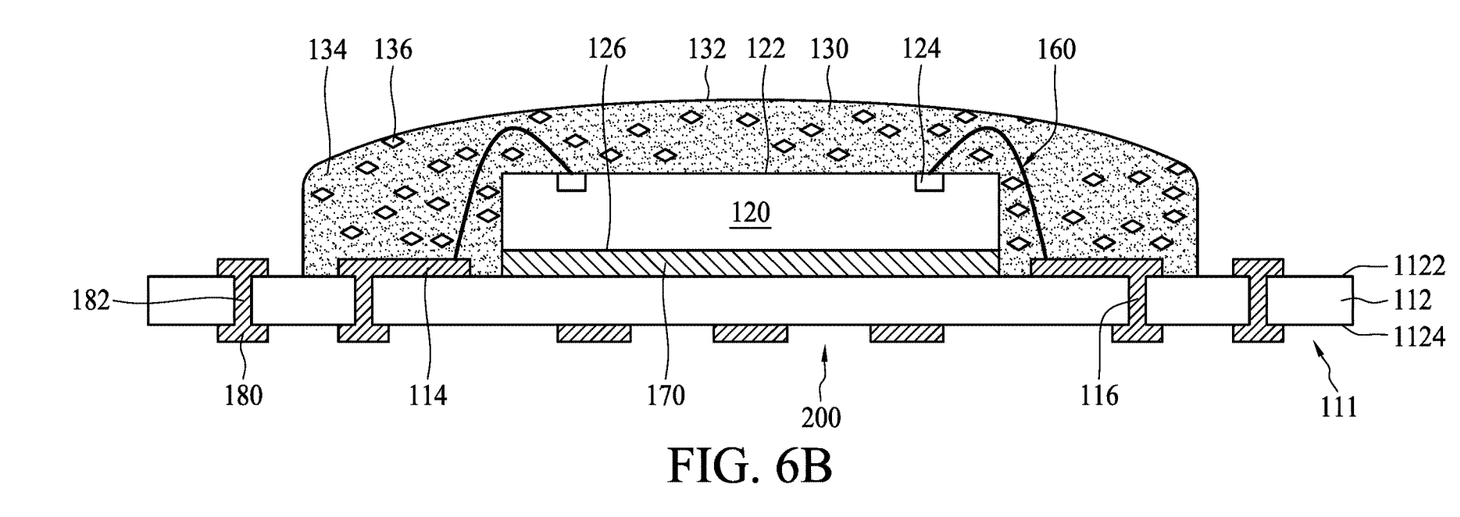

Referring to FIGS. 6A and 6B, in some embodiments, a molding process is performed to form a sealant 130 on the main component 120 and the wires 160 according to a step 308 in FIG. 3. In some embodiments, the sealant 130 completely covers the main component 120, the wires 160, and a portion of the front surface 1122. In some embodiments, the periphery 111 of the supporting member 110 is exposed through the sealant 130. In some embodiments, the grounding contacts 180 are exposed through the sealant 130. In some embodiments, the sealant 130 may be a polymer composite material, such as epoxy resin, epoxy acrylate, or polymer with proper filler material 136. In some embodiments, the sealant 130 may include a thermoset polymer material. In some embodiments, the sealant 130 is non-conductive and environmentally protects the main device 200 from external elements. In some embodiments, a plurality of toner particles 134 may additionally be applied within the sealant 130. In some embodiments, the toner particles 136 with block color may readily transfer heat generated from the main component 120 to the supporting member 110. In some embodiments, suitable methods for forming the sealant 130 may include a dispending process, a transfer molding process, a compression molding process, a liquid encapsulant molding process, or the like. In some embodiments, the sealant 130 may be dispensed in liquid form to cover the main component 120 and the wires 160. Subsequently, a curing process is performed to solidify the sealant 130. In some embodiments, the sealant 130 may be cured by a radical curing process, an ultraviolet (UV) curing process and/or a heat curing process. In FIG. 6A, the sealant 130 has a substantially flat top surface 132. In FIG. 6B, the top surface 132 of the sealant 130 is a substantially rounded surface.

Figure 7:
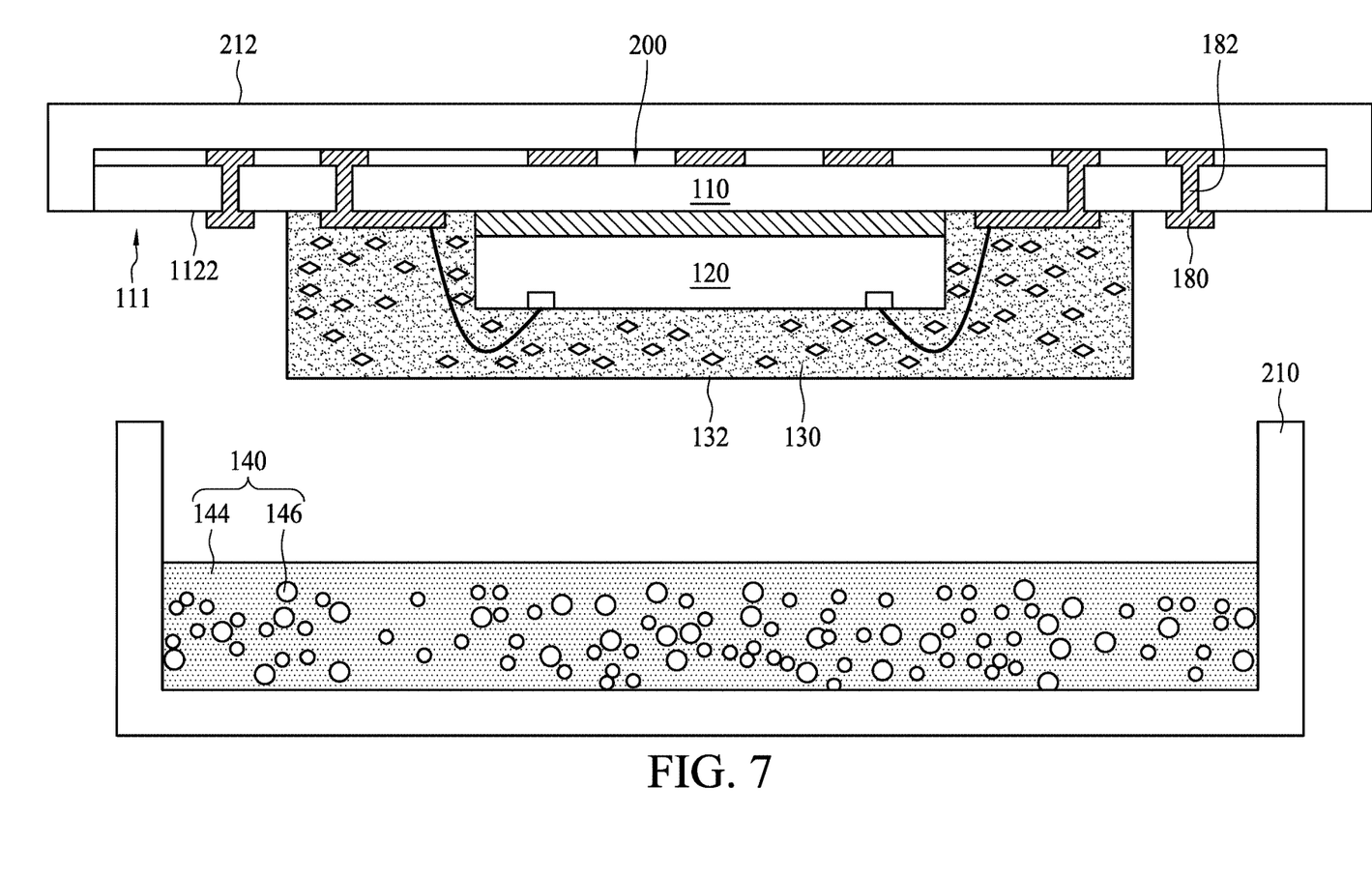

Referring to FIG. 7, in some embodiments, an encapsulation process is performed to form a conductive encapsulant 140 containing a plurality of conductive particles 146 to cover the sealant 130 according to a step 310 in FIG. 4. In some embodiments, the conductive encapsulant 140 is dispensed in liquid form into a first molding cavity 210, and the main device 200, covered with the sealant 130, is placed within a second molding cavity 212 with the functional surface 122 of the main component 120 facing down toward the conductive encapsulant 140. In some embodiments, the conductive encapsulant 140 includes a resin binder 144, for example, epoxy, and a plurality of conductive particles 146, affording conductive paths through the conductive encapsulant 140, distributed in the resin binder 144. In some embodiments, methods such as ultrasonication, ball milling, high-speed shearing, chemical reforming, etc., can be used to evenly distribute the conductive particles 146 in the resin binder 144. In some embodiments, the conductive encapsulant 140 is heated to an elevated temperature high enough to melt the resin binder 144. The resin binder 144 preferably has a melting point less than the melting point of the sealant 130 to prevent melting of the sealant 130 when the resin binder 144 is subjected to heating. In some embodiments, the resin binder 144 has a melting temperature of approximately 175 degrees Celsius.

Figure 8:
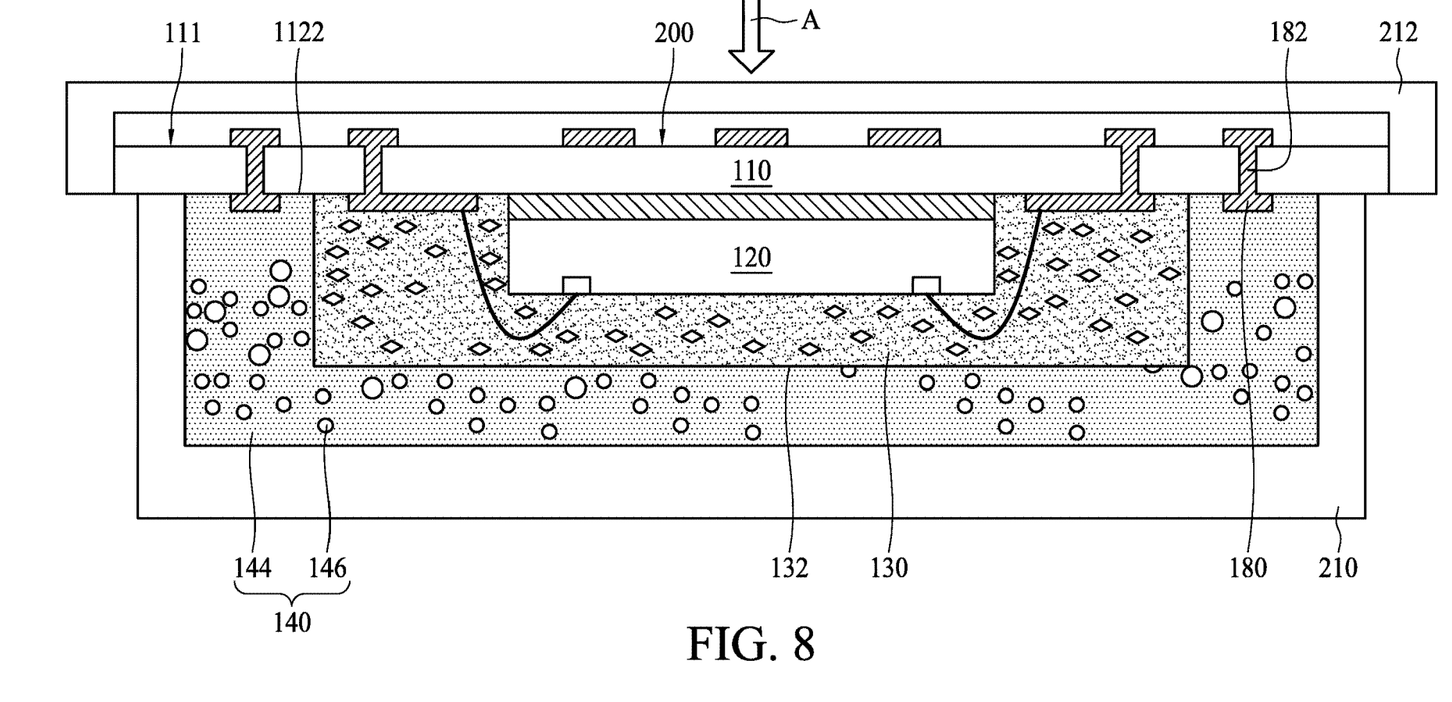

Referring to FIG. 8, an appropriate pressure is applied, represented by the arrow A, to force the main device 200, covered with the sealant 130, to come into contact with the conductive encapsulant 140, wherein heat and pressure are maintained until the conductive encapsulant 140 has cured.

Figure 9:
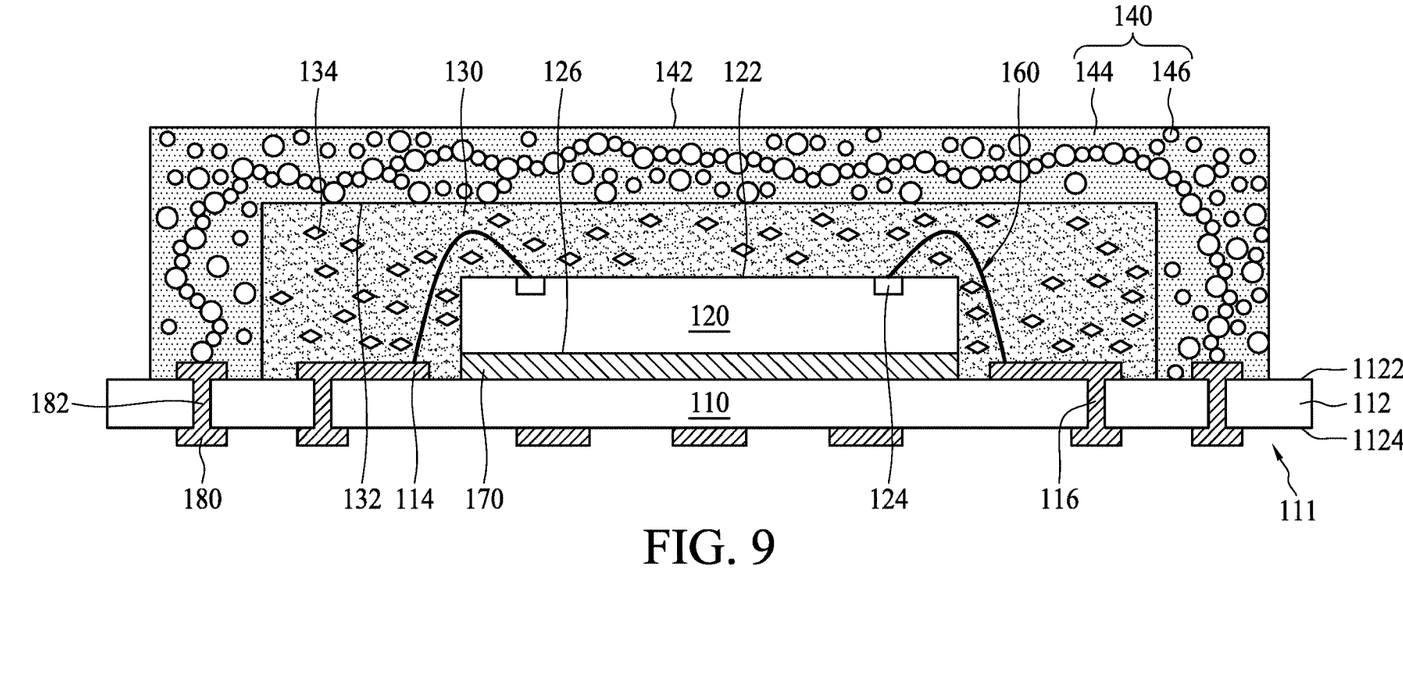

Referring to FIG. 9, the conductive encapsulant 140, after undergoing the encapsulation process, is a solid, uniform conductive encapsulant 140. In some embodiments, the conductive encapsulant 140 encases the sealant 130 and the grounding contacts 180 exposed through the sealant 130. In some embodiments, a portion of the periphery 111 of the supporting member 110 where the grounding contacts 180 are not placed is exposed through the conductive encapsulant 140.

Figure 10:
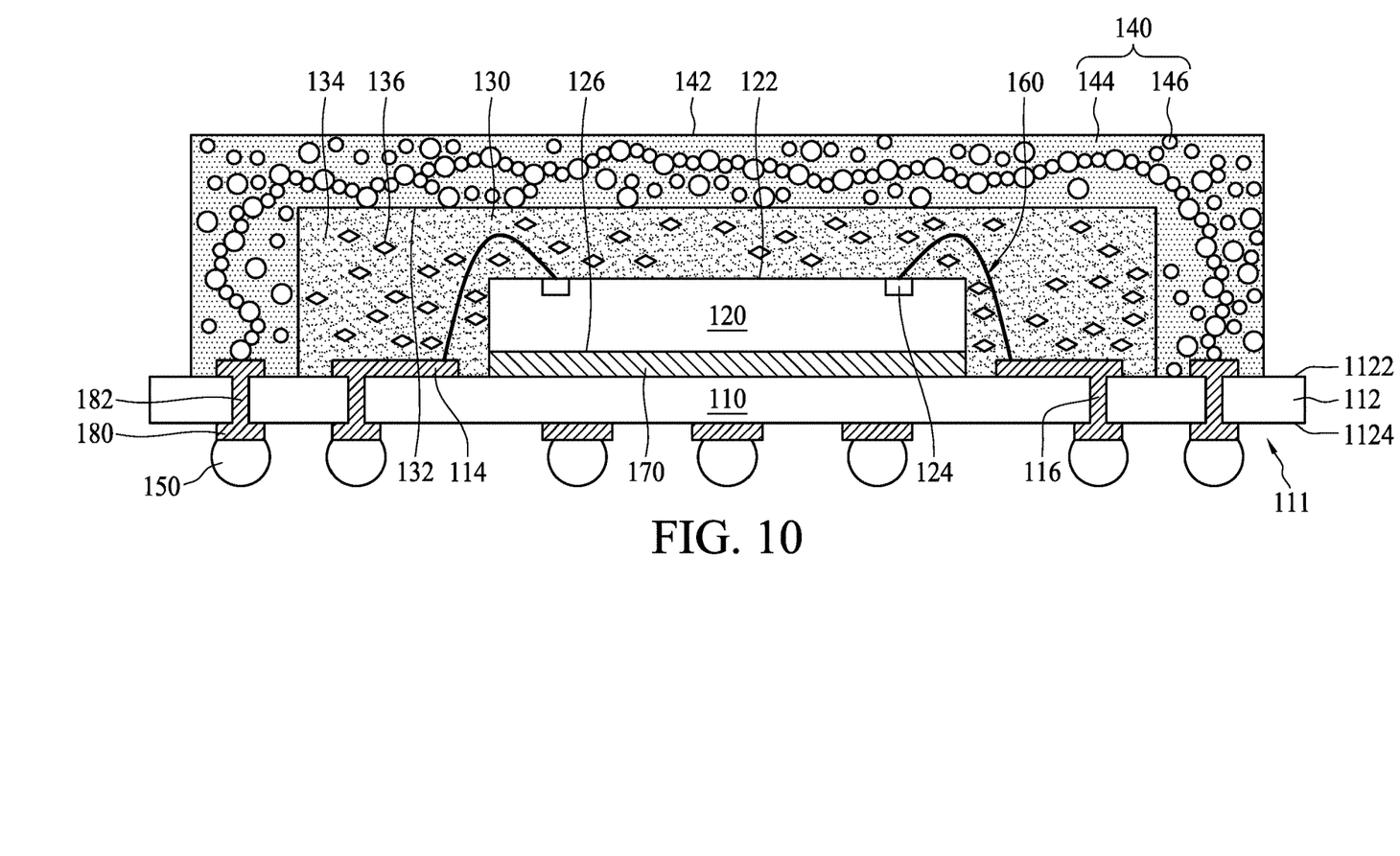

Referring to FIG. 10, in some embodiments, a plurality of solder bumps 150 are mounted onto the supporting member 110 according to a step 312 in FIG. 4. In some embodiments, the solder bumps 150 are disposed on the circuit patterns 114 placed on the back surface 1124. In some embodiments, the solder bumps 150 are mounted by initially placing a solder flux (not shown) on the circuit patterns 114. The solder flux may be applied by brushing, spraying, stenciling, or other methods. The solder flux generally has an acidic component that removes oxide barriers, and an adhesive quality that helps to prevent movement during the process. Once the solder flux is in place, the solder bumps 150 may be physically placed in contact with the solder flux using, for example, a pick and place operation, although any suitable placement methodology may be utilized. Once the solder bumps 150 are in contact with the solder flux, a reflow may be performed to reflow the material of the solder bumps 150 and the solder flux to physically bond the solder bumps 150 to the circuit patterns 114.

Figure 11:
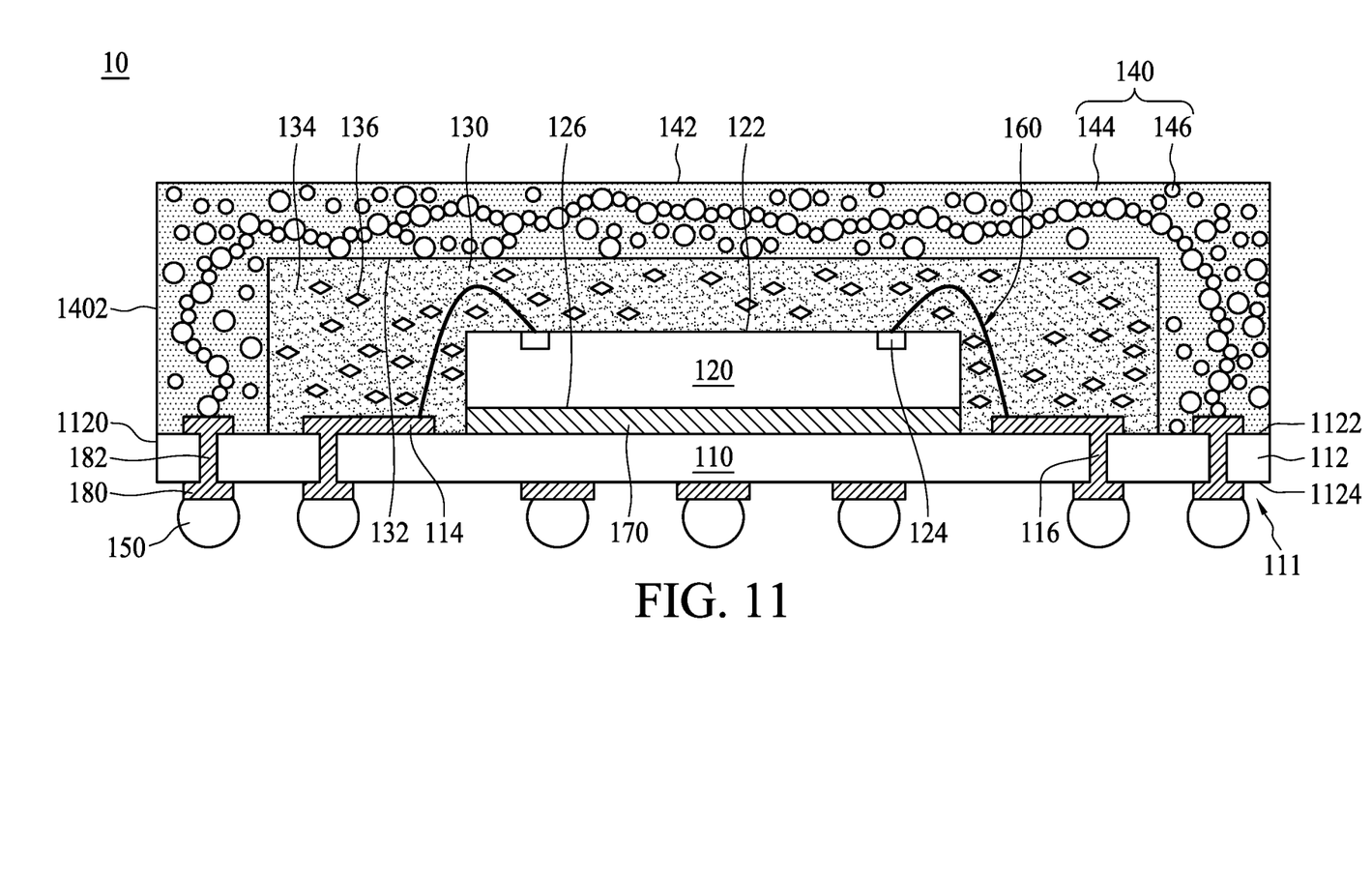

Referring to FIG. 11, a dicing process is optionally performed to remove the periphery 111 of the supporting member 110 exposed through the conductive encapsulant 140 according to a step 314 in FIG. 4. Accordingly, the package device 10 is completely formed. In some embodiments, the substrate 112 has a sidewall 1120 coplanar with a lateral surface 1402 of the conductive encapsulant 140. In some embodiments, the dicing process may be performed, for example, by using a dicing saw, laser or other appropriate cutting technique.

In conclusion, with the configuration of the package device 10/10A/10B, an electrical pathway for grounding undesired electromagnetic radiation is introduced into the solder bumps 150, and connected to the grounding contacts 180, the grounding vias 182, and the conductive encapsulant 140 containing conductive particles with high electrical conductivity. As a result, when the solder bumps 180 are electrically connected to the grounding voltage, an EMI shielding functionality is provided.

One aspect of the present disclosure provides a package device. The package device includes a supporting member, a main component, a sealant and a conductive encapsulant. The supporting member includes a plurality of grounding contacts. The main component is mounted on the supporting member. The sealant covers the main component. The conductive encapsulant encases the sealant and the grounding contacts exposed through the sealant.

One aspect of the present disclosure provides a method of manufacturing a package device. The method includes steps of providing a main device comprising a supporting member and a main component disposed on the supporting member and electrically connected to the supporting member, wherein the supporting member comprises a plurality of grounding contacts encircling the main component; performing a molding process to form a sealant to cover the main component; and performing an encapsulation process to form a conductive encapsulant to encase the sealant and the grounding contacts.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A package device, comprising:
  a supporting member comprising a substrate having a planar front surface and a planar back surface opposite to the planar front surface, and the supporting member having a plurality of grounding contacts placed on the planar front surface and the planar back surface of the substrate, a plurality of grounding vias penetrating through the substrate and electrically connecting the grounding contacts on the planar front surface to the grounding contacts on the planar back surface, and a plurality of solder bumps attached to the grounding contacts on the planar back surface;
  a main component mounted on the planar front surface of the substrate of the supporting member;
  a sealant covering the main component;
  a plurality of opaque toner particles distributed in the sealant to form an opaque sealant and transferring heat generated from the main component to the supporting member; and
  a conductive encapsulant encasing the sealant and the grounding contacts on the planar front surface exposed through the sealant, wherein the conductive encapsulant includes a plurality of conductive particles distributed in the conductive encapsulant and a resin binder for distributing the plurality of conductive particles,, wherein the plurality of conductive particles are connected to each other through the conductive encapsulant and contacted with the plurality of grounding contacts which are placed on the planar front surface of the substrate, and the plurality of conductive particles, the plurality of grounding contacts placed on the planar front surface, the plurality of grounding contacts placed on the planar back surface and electrically connected to a grounding voltage, the plurality of grounding vias electrically connecting the grounding contacts on the planar front surface to the grounding contacts on the planar back surface are connected to each other to form a continuously electrical pathway for grounding undesired electromagnetic radiation, wherein the continuously electrical pathway for grounding undesired electromagnetic radiation is introduced into the solder bumps, the grounding contacts, the grounding vias, and the conductive encapsulant when a grounding voltage is applied to the solder bumps.

2. The package device of claim 1, further comprising at least one wire bonded from the main component to a plurality of circuit patterns on the supporting member, wherein the circuit patterns are placed on the planar front surface and the planar back surface, and the circuit patterns on the planar front surface are electrically connected to the circuit patterns on the planar back surface using a plurality of through vias extending through the planar front surface and the planar back surface.

3. The package device of claim 1, wherein the conductive encapsulant has a lateral surface coplanar with a sidewall of the substrate.

4. The package device of claim 1, wherein the resin binder has a melting point less than a melting point of the sealant.

5. The package device of claim 1, wherein the conductive encapsulant has a substantially flat upper surface.

6. A method of manufacturing a package device, comprising:
  providing a main device comprising a supporting member and a main component, wherein the main component is disposed on the supporting member and electrically connected to the supporting member, and the supporting member comprises a substrate having a planar front surface and a plurality of grounding contacts encircling the main component, the main component and a planar back surface opposite to the planar front surface, and the supporting member has the plurality of grounding contacts placed on the planar front surface and the planar back surface of the substrate, and a plurality of grounding vias penetrating through the substrate and electrically connecting the grounding contacts on the planar front surface to the grounding contacts on the planar back surface;

mounting a plurality of solder bumps onto the grounding contacts on a planar back surface of a substrate of the supporting member;

performing a molding process to form a sealant to cover the main component;

adding and distributing a plurality of opaque toner particles in the sealant to form an opaque sealant, the plurality of opaque toner particles transferring heat generated from the main component to the supporting member;

distributing a plurality of conductive particles in a resin binder to form a conductive encapsulant; and performing an encapsulation process by the conductive encapsulant to encase the sealant and the grounding contacts;

wherein the encapsulation process comprises:
    placing the main component, covered with the sealant, within a first molding cavity;
    placing the conductive encapsulant in a second molding cavity;
    applying a pressure to force the main device, covered with the sealant, to come into contact with the conductive encapsulant; and
    curing the conductive encapsulant;
    wherein through the conductive encapsulant cured the plurality of conductive particles are connected to each other and contacted with the plurality of grounding contacts which are placed on the planar front surface of the substrate, and the plurality of conductive particles, the plurality of grounding contacts placed on the planar front surface, the plurality of grounding contacts placed on the planar back surface and electrically connected to a grounding voltage, the plurality of grounding vias electrically connecting the grounding contacts on the planar front surface to the grounding contacts on the planar back surface are connected to each other to form a continuously electrical pathway for grounding undesired electromagnetic radiation, wherein the continuously electrical pathway for grounding undesired electromagnetic radiation is introduced into the solder bumps, the grounding contacts, the grounding vias, and the conductive encapsulant when a grounding voltage is applied to the solder bumps.

7. The method of claim 6, wherein the planar front surface is opposite to the planar back surface, the grounding contacts are placed on the planar back surface, and the supporting member further comprises a plurality of grounding vias penetrating through the substrate and electrically connecting the grounding contacts on the planar front surface to the grounding contacts on the planar back surface.

8. The method of claim 6, further comprising melting the conductive encapsulant before the applying of the pressure.

9. The method of claim 6, further comprising depositing an adhesive between the main component and the supporting member to secure the main component to the supporting member.

* * * * *